United States Patent [19]

Albanese

[11] Patent Number: 4,683,573
[45] Date of Patent: Jul. 28, 1987

[54] TEMPERATURE STABILIZATION OF INJECTION LASERS

[75] Inventor: Andres Albanese, Morristown, N.J.

[73] Assignee: Bell Communications Research, Inc., Livingston, N.J.

[21] Appl. No.: 784,878

[22] PCT Filed: Sep. 24, 1985

[86] PCT No.: PCT/US85/01814
§ 371 Date: Sep. 24, 1985
§ 102(e) Date: Sep. 24, 1985

[87] PCT Pub. No.: WO87/01875
PCT Pub. Date: Mar. 26, 1987

[51] Int. Cl.⁴ .............................................. H01S 3/04
[52] U.S. Cl. ...................................... 372/34; 372/29; 372/38; 372/33
[58] Field of Search ...................... 372/34, 29, 31, 32, 372/38, 33, 36

[56] References Cited

U.S. PATENT DOCUMENTS

| | | | |
|---|---|---|---|
| 3,541,300 | 11/1970 | Stadnik et al. | 219/210 |
| 3,588,253 | 6/1971 | Wittmann | 356/93 |
| 3,858,056 | 12/1974 | Melamed et al. | 307/88.3 |
| 3,898,583 | 8/1975 | Shuey | 372/29 |
| 4,081,670 | 3/1978 | Albanese | 250/199 |
| 4,181,899 | 1/1980 | Liu | 331/94.5 |
| 4,243,952 | 1/1981 | Patterson | 331/94.5 |
| 4,387,462 | 6/1983 | Markus | 372/32 |
| 4,484,331 | 11/1984 | Miller | 372/29 |
| 4,485,475 | 11/1984 | Large et al. | 372/32 |
| 4,604,753 | 8/1986 | Sawai | 372/29 |

FOREIGN PATENT DOCUMENTS

| | | | |
|---|---|---|---|
| 0053979 | 4/1979 | Japan | 372/36 |
| 0063895 | 5/1980 | Japan | 372/29 |
| 0107285 | 8/1980 | Japan | 372/34 |
| 0112788 | 9/1981 | Japan | 372/34 |
| 58-77272 | 5/1983 | Japan | |
| 0176988 | 10/1983 | Japan | 372/36 |

OTHER PUBLICATIONS

Wittke et al; "Stabilization of CW Injection Lasers"; RCA Tech. notes, TN No. 1005, Apr. 9, 1975.
A. Albanese, "An Automatic Bias Control (ABC) Circuit for Injection Lasers," *The Bell System Technical Journal*, vol. 57, No. 5, May.–Jun. 1978, pp. 1533–1544.
P. D. Wright, W. B. Joyce and D. C. Craft, "Electrical Derivative Characteristics of InGaAsP Buried Heterostructure Lasers," *J. Appl. Phys.*, vol. 53, No. 3, Mar. 1982, pp. 1364–1372.
S. Kobayashi and T. Kimura, "Automatic Frequency Control in a Semiconductor Laser and an Optical Amplifier," *J. of Lightwave Technology*, vol. LT-1, No. 2, Jun. 1983, pp. 394–401.

*Primary Examiner*—Leon Scott, Jr.
*Attorney, Agent, or Firm*—James W. Falk; John T. Peoples

[57] ABSTRACT

Apparatus is disclosed which stabilizes the temperature, and thereby the output wavelength, of an injection laser. Means (50 and 23) monitor the laser terminal voltage across a laser (11) and derive a voltage laser therefrom which is proportional to the junction voltage of the laser. Means (24) compares the voltage to a reference value from source (27) and a temperature controller (35) adjusts the laser temperature in response to the results of the comparison.

Further embodiments of the present invention vary the output wavelength of the laser by varying the reference value from source (27) against which the laser junction voltage is compared.

5 Claims, 5 Drawing Figures

TEMPERATURE STABILIZATION OF INJECTION LASERS

TECHNICAL FIELD

The present invention pertains to apparatus for stabilizing the temperature, and thereby the output wavelength, of injection lasers.

BACKGROUND OF THE INVENTION

Optical communications systems utilizing lasers, and having high-bit rate modulation and/or wavelength division multiplexing, require accurate control of laser wavelength. Such accurate control is difficult to implement in present transmission systems because the laser wavelength is monitored by using elaborate and complex optical components and/or circuit elements. Some examples of the prior art include: U.S. Pat. Nos. 3,588,253, 4,387,462, and Japanese Patent Disclosure No. 1983-77272.

U.S. Pat. No. 3,588,253 discloses a spectrograph which includes a temperature tunable laser diode. The laser diode is placed in a Dewar flask and liquid helium is used to control the temperature of the environment in which the laser diode is positioned. Since the wavelength of single mode emission from the laser diode depends upon the temperature thereof, the wavelength of the single mode emission from the diode is varied by varying the temperature of the diode.

U.S. Pat. No. 4,387,462 discloses a temperature stabilization apparatus which stabilizes a single frequency laser. The laser is disposed in a hard-sill glass laser tube having a resistance coating on an exterior surface thereof. A power supply is coupled to the resistance coating for heating the glass tube. Temperature sensors are mounted at various locations to monitor the temperature of the laser tube. The temperature sensors are coupled to a temperature comtroller, which in turn, is connected to the power supply for controlling the temperature of the tube.

Japanese Pat. No. 1983-77272 discloses an apparatus for temperature control of a semiconductor laser. The apparatus uses a photodiode, having a predetermined voltage-temperature characteristic, to sense the temperature of a heat sink upon which the photodiode and the laser are disposed. A thermo-module adjusts the temperature of the laser in response to variations in the photodiode output voltage.

If the large bandwidthe capability of presently available single-mode fibers is to be used to its full capacity, it is necessary to develop a compact and integrated wavelength stabilization apparatus for laser transmitters other than those disclosed in the art.

SUMMARY OF THE INVENTION

Apparatus in accordance with the present invention stabilizes the temperature, and thereby the output wavelength, of an injection laser by monitoring the laser terminal voltage and deriving a voltage therefrom which varies with the temperature of the laser. The temperature of the laser is then varied in response to this derived voltage. Thus, by monitoring the voltage, the inventive apparatus can more quickly and accurately stabilize the laser's temperature than apparatus that monitor laser heat sink temperatures and whose operation depends on the thermal lag of the heat sink as well as apparatus whose operation depends on the position of a temperature sensor.

In one embodiment, a circuit senses the laser's terminal voltage and derives a voltage therefrom which is proportional to the laser's junction voltage. Further circuitry compares the voltage to a reference voltage and generates an output signal whose value depends on the comparison. The output signal serves as an input into a temperature controller, for example a thermoelectric cooler, in order to adjust the laser's temperature. The thermoelectric cooler is a conventionally known device which has the property of getting colder when electric current flows in one direction and getting hotter when the direction of the current is reversed.

The above-described embodiment depends upon the fact that the junction voltage of an injection laser saturates above laser current threshold at a value—referred to as the "saturation voltage"—which is proportional to the energy of the semiconductor bandgap, and thereby to the laser output frequency. Further, the energy of the semiconductor bandgap, and thereby the laser output frequency, varies as the laser temperature varies. As a result, the "saturation voltage" varies as the laser temperature varies, and there is a direct correlation between shifts in "saturation voltage" and shifts in laser output frequency due to laser temperature variation. Thus, by monitoring the laser's junction voltage and by controlling the laser's temperature so that the junction voltage is stabilized, the laser output frequency—and hence the wavelength—is stabilized.

In an embodiment of the present invention which is similar to the one discussed above, the frequencey, and hence the wavelength, of the laser is varied by varying the reference voltage.

In still further embodiments of the present invention which are useful in wavelength multiplexer communications systems, the relative wavelength differences between several lasers are stabilized by using a voltage which is proportional to the junction voltage of a first laser as the reference voltage for a second laser and using a voltage which is proportional to the junction voltage of the second laser as the reference voltage for a third laser and so forth.

BRIEF DESCRIPTION OF THE DRAWING

A complete understanding of the present invention may be gained by considering the following detailed description in conjunction with the accompanying drawing, in which.

To facilitate reader understanding, identical reference numerals are used to designate elements common to the figures.

DETAILED DESCRIPTION

Figure 1:
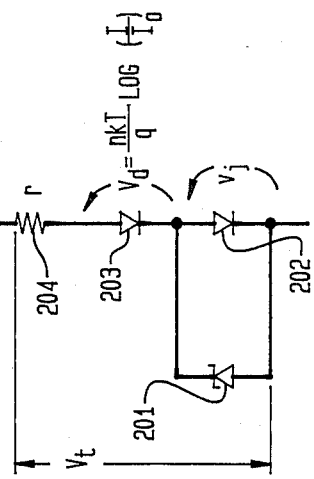
FIG. 1 shows, in pictorial form, an equivalent circuit representation of an injection laser.

FIG. 1 shows an equivalent circuit representation of a buried-heterostructure injection laser. The equivalent circuit comprises the parallel combination of ideal diode 202 and zener diode 201 in series with resistance 204 and ideal diode 203. Such an equivalent circuit representation is found in an article entitled "Electrical Derivative Characteristics of InGaAsP Buried Heterostructure Lasers", by P. D. Wright, W. B. Joyce, and D. C. Craft in *J. Appl. Phys.* Vol. 53, No. 3, March 1982, pp. 1364–1372. According to this representation, the laser junction voltage, $v_j$, i.e. the voltage between the cathode and anode of ideal diode 202, is given by:

$$v_j = V_t(I) - a \log(I/I_o) - rI, \quad (1)$$

where $V_t(I)$ is the laser terminal voltage as a function of the laser current I, r is the series resistance of resistor 204, a is the well known diode constant nkT/q of ideal diode 203, and $I_o$ is the reverse current of ideal diode 203.

When $v_j$ is assumed constant, for example when the laser diode is saturated, a and r are competed from derivatives of $V_t(I)$ with respect to I as follows:

$$a = -\frac{I^2 d^2 V_t(I)}{dI^2} \quad (2)$$

$$r = \frac{dV_t(I)}{dI} - \frac{a}{I} \quad (3)$$

Figure 2:
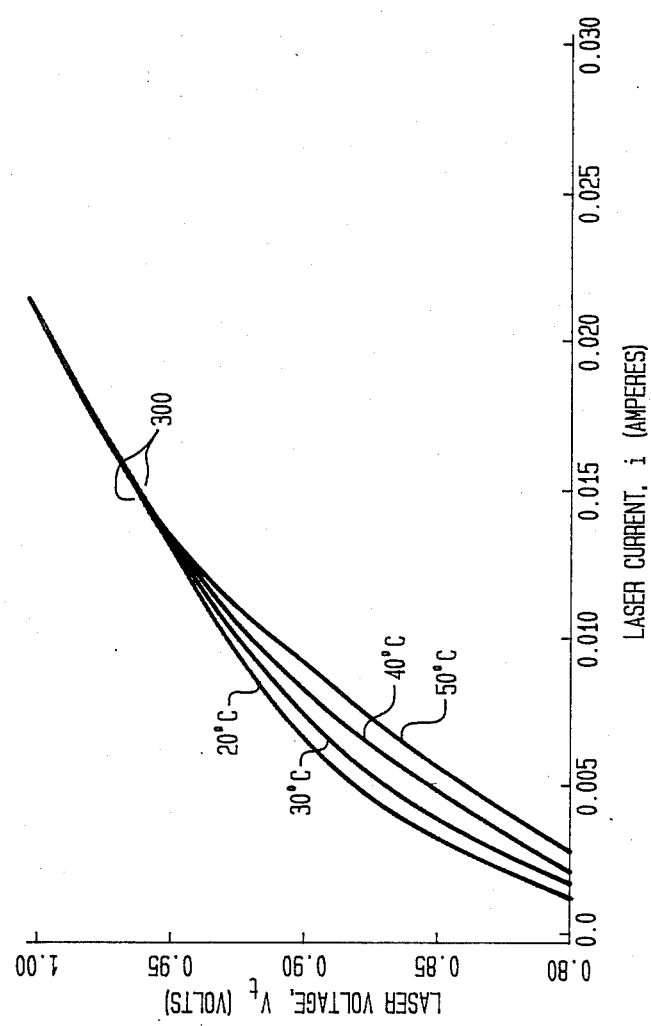
FIG. 2 shows, in graphical form, the laser terminal voltage as a function of laser current for an InGaAsP buried-heterostructure laser operating at 1.5 microns output wavelength at temperatures of 20°, 30°, 40° and 50° C.

For a specific laser, the unknown values in equation (1), i.e. a and r, are determined by first fitting equation (1) to experimentally determined values of the laser's terminal voltage in the region above threshold where $v_j$ saturates and then computing a and r using equations (2) and (3). For example, FIG. 2 shows fitted curves of the laser's terminal voltage as a function of laser curent for an InGaAsP buried-heterostructure laser operating at 1.5 microns output wavelength at temperatures of 20°, 30°, 40° and 50° C. Experimental data in region 300, where the laser is saturated, was used to fit equation (1). Region 300 is also the region where the derivatives of equations (2) and (3) are computed. Using the experimental data for the above-referenced InGaAsP laser, it is found that a=0.00505 volts and r=6.45 ohms.

The term $I_o$ in equation (1) is a comstant term, ideally independent of I, which is used to select a compensation diode as discussed shortly. The term $I_o$ is computed by matching $v_j$ to the laser's bandgap energy obtained from optical wavelength measurements. The voltage $v_j$ is directly proportional to the bandgap energy and therefore inversely proportional to the output wavelength. Thus, equation (1), at a particular value of I, is used to determine $I_o$. This is done by measuring $V_t$ and the laser's output wavelength at a particular value of I. Next, the left hand side of equation (1) is computed in terms of the measured wavelength, i.e.

$$v_j = \frac{hc}{q(\text{measured wavelength})}$$

where h is Planck's constant and c is the speed of light. Next, the right hand side of equation (1) is computed by using the measured values of I, $V_t$, a, and r. Then the $I_o$ value on the right hand side of equation (1) is adjusted to match the left hand side.

Figure 3:
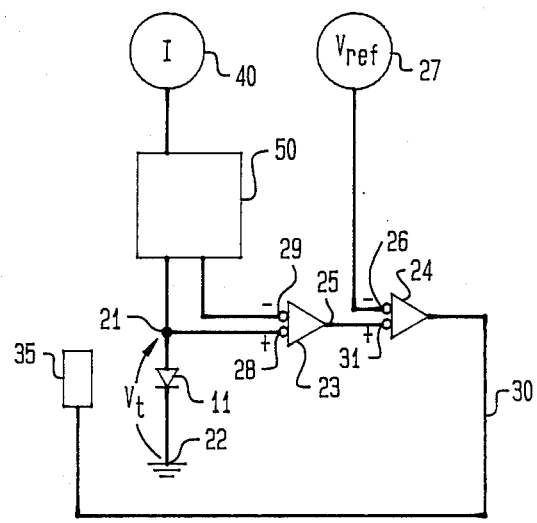
FIG. 3 shows, in pictorial form, a block diagram of an apparatus fabricated in accordance with the present invention for stabilizing the laser temperature, and thereby the laser output wavelength.

FIG. 3 shows a block diagram of an apparatus fabricated in accordance with the present invention for stabilizing laser temperature, and thereby the laser output wavelength. Laser terminal voltage $V_t$, taken at points 21 and 22 across laser diode 11, is input to terminal 28 of operational amplifier 23. Current source 40 injects current into laser 11 through circuit block 50. Referring to FIG. 1 and equation (1), when laser 11 is modulated above threshold by varying the current injected from current source 40, resistor 204 and diode 203 of the equivalent circuit representation provide voltage drops which are functions of the injected current. Circuit block 50 comprises circuit elements which, as a function of the current, form a voltage drop which matches that of resistor 204 and diode 203. This voltage drop is provided as input to terminal 29 of operational amplifier 23. The output of operational amplifer 23, voltage 25, is thereby proportional to the laser junction voltage of laser 11, $v_j$. However, if laser 11 is to be operated without modulation, then the terms in equation (1) which are functions of I are merely constants. In this case, circuit block 50 may be removed and a constant reference voltage, equal to the constant current volatage drop of resistor 204 and diode 203, may be applied to terminal 29 of operational amplifier 23.

Laser output wavelength stabilization is performed by comparing voltage 25 against a reference voltage, $V_{ref}$. Thus, voltage 25, output from operational amplifier 23, is input to terminal 31 of operational amplifier 24. $V_{ref}$ from voltage source 27 is input to terminal 26 of operational amplifier 24. Operational amplifier 24 compares $v_j$ and $V_{ref}$ and amplifies the difference as voltage 30. Voltage 30, output from operational amplifier 24, drives thermoelectric cooler 35 which adjusts the laser temperature and thereby stabilizes the output wavelength of laser 11.

Figure 4:
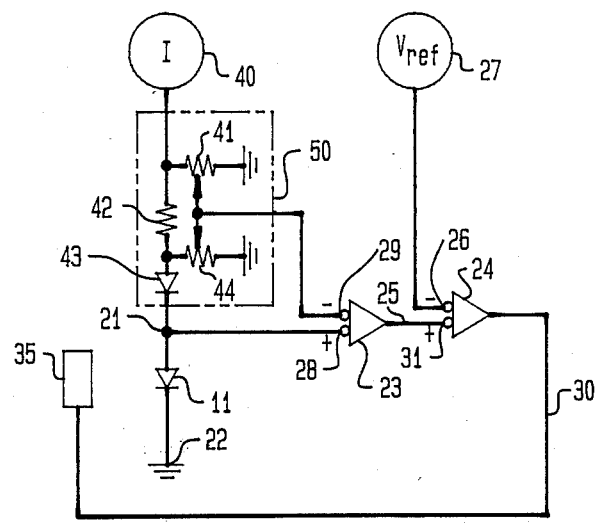
FIG. 4 shows, in pictorial form, a circuit diagram of an apparatus fabricated in accordance with the present invention of stabilizing an injection laser's temperature, and thereby the laser's output wavelength.

FIG. 4 shows a block diagram of an apparatus fabricated in accordance with the present invention for stabilizing an injection laser's temperature, and thereby the laser's output wavelength, wherein resistor 42, diode 43 and adjustable resistors 41 and 44 embody circuit block 50 shown in FIG. 3. Diode 43 performs the function of canceling the nonlinear portion of the laser equivalent circuit arising from diode 203. Circuit elements 41–44 compensate for resistor 204 and diode 203 of the laser equivalent circuit in a manner similar to that disclosed with respect to the circuit of FIG. 8 of an article entitled "An Automatic Bias Control (ABC) Circuit for Injection Lasers" by A. Albanese in *The Bell System Technical Journal*, vol. 57, No. 5, May–June 1978, pp. 1533,1544, which circuit of FIG. 8 is also disclosed in U.S. Pat. No. 4,081,670.

More specifically, the voltage at terminal 29 of operational amplifier 23 is given by:

$$V_- = k_1(v_j + rI + v_d + v_x) + K_2(v_j + rI + v_d + v_x + RI) \quad (4)$$

where I is the laser injection current, $v_j$ is the laser's junction voltage, $v_d$ is the voltage drop across the laser's internal diode 203 from FIG. 1, $v_x$ is the voltage drop across diode 43, R is the resistance of resistor 42, $k_1$ is less than one and is the constant of adjustable resistor 44, and $k_2$ is less than one and is the constant of adjustable resistor 41.

The voltage at terminal 28 of operational amplifier 23 is given by:

$$V_+ = v_j + rI + v_d \qquad (5)$$

Thus, the output voltage 25 of operational amplifier 23 is directly proportinal to:

$$v_j(1-k_1-k_2) + I[r(1-k_1-k_2) - Rk_2] + [v_d(1-k_1-k_2) - v_x(k_1+k_2)] \qquad (6)$$

In order for voltage 25 to be proportional to $v_j$ and independent of injection current, I, the second and third terms of equation 6 must be equal to zero. This results in the following:

$$v_x/v_d = (1-k_2)/(k_1+k_2) \qquad (7)$$

$$R/r = (1-k_1-k_2)/k_2 \qquad (8)$$

Thus, $k_1$ and $k_2$ are varied in such a fashion that equations (7) and (8) are satisfied. For the case that $v_x = v_d$, i.e. diodes 43 and 203 are equivalent, we find that $k_1 + k_2 = \frac{1}{2}$ and $Rk_2/r = \frac{1}{2}$. If, in addition, $R = r$, i.e. resistors 42 and 204 are equivalent, then $k_2 = \frac{1}{2}$ and $k_1 = 0$. This means that by using a resistor and diode which are equivalent to resistor 204 and diode 203 of laser diode 11, respectively, a single adjustable resistor having a constant $k_2 = \frac{1}{2}$ can be used. Such an equivalent resistor and diode can be fabricated from the same materials used to form the laser diode itself.

In practice, when resistance 42 and diode 43 do not match resistance 204 and diode 203, respectively, one would choose resistor 42 to have as close a value as possible to the value r of resistor 204 and diode 43 to have as close a value as possible to the values a and $I_o$ of diode 203. (These values of a, $I_o$ and r are determined as described above.) As discussed above, when the values of resistor 42 and diode 43 are equal to the values of resistor 204 and diode 203, respectively, $k_2 = \frac{1}{2}$ and $k_1 = 0$. In order to determine the values of $k_1$ and $k_2$ when the resistors and diodes are close, but not equal, in value, $k_2 = \frac{1}{2}$ is initially selected and $k_1$ is varied near 0 in the following manner. The goal is to obtain a value of voltage 25 which is proportional to $v_j$. This means that for values of injection current above threshold, voltages 25 should be flat as the injection current I is varied. Thus, vary injection current above threshold for one value of $k_1$. If voltage 25 is not flat, change $k_1$ and try again. When voltage 25 is reasonably flat, $k_2$ is varied slightly and the process is repeated until the appropriate values of $k_1$ and $k_2$ are determined for use in the circuit shown in FIG. 4. Once the appropriate values of $k_1$ and $k_2$ are determined, they may be implemented in many ways known in the art. For example, they may be implemented as potentiometers, or as laser trimmed adjustable resistors and so forth.

As discussed above, the laser temperature determines the output wavelength. Thus, if $V_{ref}$ from voltage source 27 in FIGS. 3 and 4 were changed, the laser temperature provided by thermoelectric cooler 35 would change and thereby the output wavelength of laser 11. Thus embodiment of the present invention may be fabricated to provide a tunable laser by providing a variable voltage source 27 (not shown).

In addition, further embodiments of the present invention, as shown in FIGS. 3 and 4, may be fabricated which provide automatic bias of the laser above threshold by inputting voltage 25 into a current control device like that disclosed in U.S. Pat. No. 4,081,670. In such an arrangement, voltage 25 is input into the ABC circuit of U.S. Pat. No. 4,081,670 and the output from such ABC circuit is input into laser diode 11 through circuit block 50 of FIG. 3 or through resistor 42 and diode 43 of FIG. 4.

Figure 5:
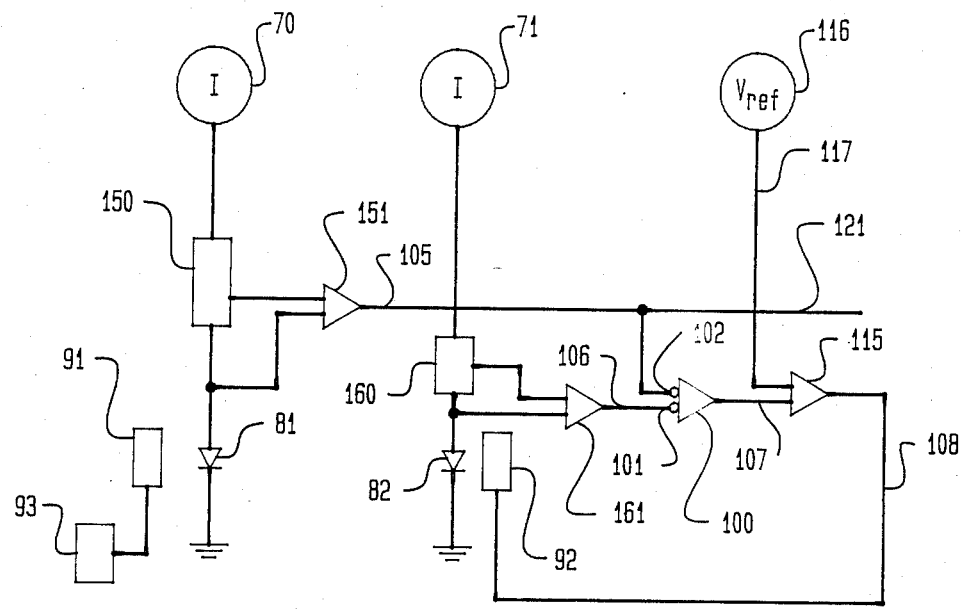
FIG. 5 shows, in pictorial form, a block diagram of an apparatus fabricated in accordance with the present invention wherein the wavelength difference between the outputs of several lasers are stabilized.

FIG. 5 shows a block diagram of an apparatus fabricated in accordance with the present invention wherein the wavelength differences between the outputs of several lasers are stabilized. Such an embodiment is expected to be useful for a wavelength multiplexed communications system. Thermal apparatus, comprising for example thermocouple and thermoelectric cooler combination 91 energized by power supply 93, maintains laser 81 at a fixed temperature. Current source 70 pumps laser 81 through circuit block 150 and current source 71 pumps laser 82 through circuit block 151. Circuit blocks 150 and 160 and operational amplifiers 151 and 161 are arranged as described above so that voltages 105 and 106, outputs from operational amplifiers 151 and 161, respectively, are proportional to the laser junction voltages of lasers 81 and 82, respectively. Voltage 105 of laser 81 is input into terminal 102 of operational amplifier 100 and voltage 106 of laser 82 is input into terminal 101 of operational amplifier 100. Operational amplifier 100 generates voltage 107, the difference between the laser junction voltages. This difference is input into operational amplifier 115 along with voltage 117 from reference voltage source 116. Operational amplifier 115 outputs voltage 108 which measures the difference between voltage 107 and voltage 117. Difference voltage 108 drives thermoelectric cooler 92 to provide a temperature for laser 82 which "follows" the temperature of laser 81 by a pre-set amount, which amount is determined by voltage 117. As has been discussed above, maintaining a fixed difference between the temperatures of lasers 81 and 82 will maintain a fixed difference between the output wavelengths of lasers 81 and 82. It should be clear to those skilled in the art that further lasers may be connected to laser 81, for example by means of lead 121, in the same manner that laser 82 was connected in order to provide fixed wavelength differences among a multiplicity of lasers.

It should also be clear to those skilled in the art that further embodiments of the present invention may be made by those skilled in the art without departing from the teachings of the present invention.

What is claimed is:

1. Circuitry for stabilizing the ambient temperature of an injection laser, the injection laser having a two-terminal equivalent circuit comprising: a parallel combination of an ideal lasing diode and a zener diode, in series with a bias diode and a resistor, the circuitry comprising
    means, in electrical energy transfer relation with the injection laser, for generating a compensation voltage matching a sum of the voltages developed across the resistor and the bias diode of the laser,
    means for continuously monitoring a voltage across the two terminals of the injection laser to produce a monitored voltage indicative of the ambient temperature of the lasing diode,
    means for deriving from said compensation voltage and said monitored voltage a derived voltage corresponding to a voltage developed across the lasing diode of the laser, and
    means for adjusting the ambient temperature of the injection laser to stabilize the laser wavelength in response to said derived voltage.

2. Circuitry as recited in claim 1 wherein said means for generating includes a compensation resistor and a compensation diode equivalent, respectively, to the resistor and the bias diode of the equivalent circuit, and a current source for providing energy to the injection laser in series with the compensation resistor and the compensation diode.

3. Circuitry as resited in claim 2 wherein said means for deriving comprises means for producing said derived voltage in proportion to the voltage developed across the lasing diode of the laser.

4. Circuitry, in combination with a source for supplying energy to both said circuitry and a two-terminal injection laser, for stabilizing the ambient temperature of the laser, the laser having an equivalent circuit comprising an active lasing diode in cascade with a passive network, the energized laser having a terminal voltage drop comprising a first voltage drop equal to the voltage across the lasing diode and a second voltage drop equal to the voltage across the passive network, said circuitry comprising means, in electrical energy transfer relationship with the laser, for generating a compensation volatage substantially equal to the second voltage drop, means for monitoring the terminal voltage drop to produce a monitored voltage indicative of the ambient temperature of the laser, means for deriving from said compensation voltage and said monitored voltage a derived voltage corresponding to the first voltage drop, and means for adjusting the ambient temperature of the laser to stabilize the laser wavelength in response to said derived voltage.

5. Circuitry for stabilizing the ambient temperature difference between two injection lasers, each of the lasers having a two-terminal equivalent circuit comprising: a parallel combination of an ideal lasing diode and a zener diode, in series with a bias diode and a resistor, the circuitry comprising means for stabilizing the ambient temperature of the first of the lasers, means for deriving first and second derived voltages proportional to a voltage developed across the lasing diode of the first and second lasers, respectively, said means for deriving including means, in electrical energy transfer relation with the first laser, for generating a first compensation voltage matching a sum of voltages developed across the resistor and the bias diode of the first laser, means for continuously monitoring a voltage across the two terminals of the first laser to produce a first monitored voltage proportional to the ambient temperature of the first lasing diode, means for producing from said first compensation voltage and said first monitored voltage said first derived voltage, means, in electrical energy transfer relation with the second laser, for generating a second compensation voltage matching a sum of voltages developed across the resistor and bias diode of the second laser, means for continuously monitoring a voltage across the two terminals of the second laser to produce a second monitored voltage proportional to the ambient temperature of the second lasing diode, and means for producing from said second compensation voltage and said second monitored voltage said second derived voltage, means for comparing the difference between said first and second derived voltages with a reference voltage to produce a comparison voltage, and means for altering the ambient temperature of the second laser to stabilize the wavelength of the second laser in response to said comparison voltage.

* * * * *

UNITED STATES PATENT AND TRADEMARK OFFICE
CERTIFICATE OF CORRECTION

PATENT NO. : 4,683,573

DATED : July 28, 1987

INVENTOR(S) : Andres Albanese

It is certified that error appears in the above-identified patent and that said Letters Patent is hereby corrected as shown below:

Column 1, line 51, "bandwidthe" should read --bandwidth--.

Column 3, line 26, "competed" should read --computed--.

Column 5, line 16, that portion of the equation reading "$(1-k_2)$" should read --$(1-k_1-k_2)$--; line 62, "embodiment" should read --embodiments--.

Signed and Sealed this

Twelfth Day of July, 1988

Attest:

DONALD J. QUIGG

Attesting Officer

Commissioner of Patents and Trademarks